(12) United States Patent
Shinoto et al.

(10) Patent No.: US 12,058,292 B2
(45) Date of Patent: Aug. 6, 2024

(54) IMAGE FORMING APPARATUS

(71) Applicant: FUJIFILM Business Innovation Corp., Tokyo (JP)

(72) Inventors: Keigo Shinoto, Kanagawa (JP); Aki Yamaguchi, Kanagawa (JP); Taisuke Endo, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 301 days.

(21) Appl. No.: 17/537,486

(22) Filed: Nov. 30, 2021

(65) Prior Publication Data
US 2023/0054686 A1    Feb. 23, 2023

(30) Foreign Application Priority Data

Aug. 23, 2021  (JP) ................................ 2021-135294

(51) Int. Cl.
*H04N 1/00* (2006.01)
*H05K 7/14* (2006.01)

(52) U.S. Cl.
CPC ..... *H04N 1/00538* (2013.01); *H04N 1/00557* (2013.01); *H04N 1/00559* (2013.01); *H05K 7/1402* (2013.01); *H04N 2201/0091* (2013.01)

(58) Field of Classification Search
None
See application file for complete search history.

(56) References Cited

U.S. PATENT DOCUMENTS 10,768,574 B1 *  9/2020  Ogiwara ............ G03G 21/1633
10,842,019 B2 *  11/2020  Shinotsuka ............ G03G 15/80

FOREIGN PATENT DOCUMENTS

JP          2019152891          9/2019

* cited by examiner

*Primary Examiner* — Mukundbhai G Patel
(74) *Attorney, Agent, or Firm* — JCIPRNET (57) ABSTRACT

An image forming apparatus includes: a first housing; a second housing that is supported above the first housing; a mounting part that is provided at at least one of the first housing and the second housing; and a detachable part that is disposed across the first housing and the second housing, the detachable part being mounted detachably with respect to the mounting part and being attachable and detachable in an attaching-detaching direction that connects one side surface and another side surface of the first housing.

20 Claims, 5 Drawing Sheets

IMAGE FORMING APPARATUS

CROSS-REFERENCE TO RELATED APPLICATIONS

This application is based on and claims priority under 35 USC 119 from Japanese Patent Application No. 2021-135294 filed Aug. 23, 2021.

BACKGROUND

(i) Technical Field

The present disclosure relates to an image forming apparatus.

(ii) Related Art

For image forming apparatuses including copiers, printers, facsimile machines, and the like, the technology described in Japanese Unexamined Patent Application Publication No. 2019-152891 is known.

Japanese Unexamined Patent Application Publication No. 2019-152891 describes a configuration in which a plate-shaped power supply board (110) is mounted to the upper surface of a frame body (130) inclined downward toward the inside (far side) of an image forming apparatus. That is, in the configuration in Japanese Unexamined Patent Application Publication No. 2019-152891, the power supply board (110) is mounted with respect to a space that is narrowed on the near side and widened on the far side.

SUMMARY

Aspects of non-limiting embodiments of the present disclosure relate to a technology that makes a detachable member attachable and detachable with respect to a space provided across two housings while ensuring the strength of the housings.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided an image forming apparatus including: a first housing; a second housing that is supported above the first housing; a mounting part that is provided at at least one of the first housing and the second housing; and a detachable part that is disposed across the first housing and the second housing, the detachable part being mounted detachably with respect to the mounting part and being attachable and detachable in an attaching-detaching direction that connects one side surface and another side surface of the first housing.

BRIEF DESCRIPTION OF THE DRAWINGS

An exemplary embodiment of the present disclosure will be described in detail based on the following figures, wherein.

DETAILED DESCRIPTION

Next, specific examples (hereinafter referred to as examples) of an exemplary embodiment of the present disclosure will be described with reference to the drawings. The present disclosure is, however, not limited to the following examples.

For ease of understanding of the following description, in the drawings, the front-rear direction is denoted by the X-axis direction, the left-right direction is denoted by the Y-axis direction, the up-down direction is denoted by the Z-axis direction, and directions or sides indicated by the arrows X, −X, Y, −Y, Z, and −Z denote the front direction, the rear direction, the right direction, the left direction, the up direction, and the down direction, or the front side, the rear side, the right side, the left side, the upper side, and the lower side, respectively.

In the drawings, a middle dot in a circle denotes an arrow from the rear toward the front of the drawings, and a cross in a circle denotes an arrow from the front toward the rear of the drawings.

Note that in the following description with reference to the drawings, illustration of members other than members required for the description is omitted, as appropriate, for ease of understanding.

Example 1

Figure 1:
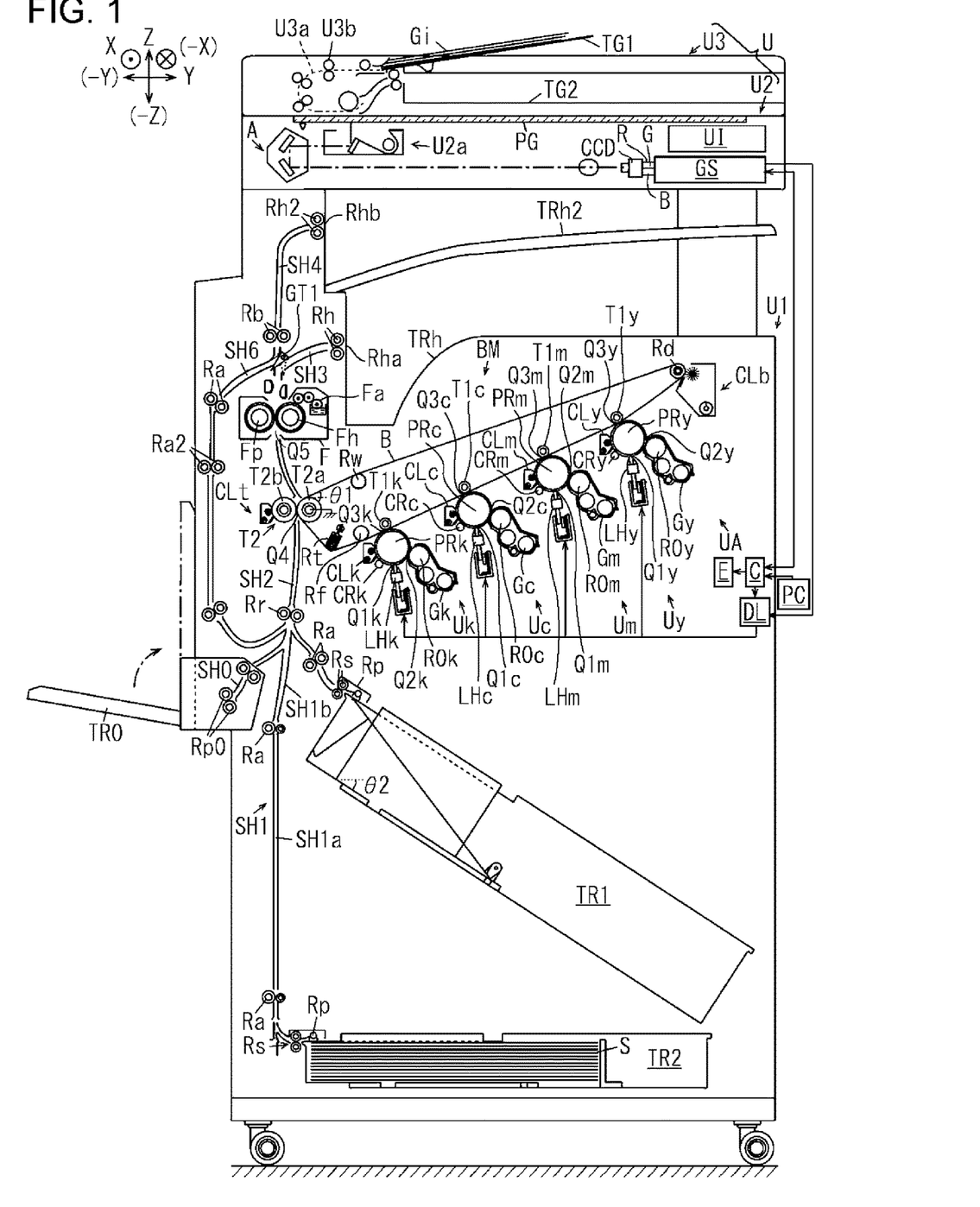
FIG. 1 is a general explanatory view of an image forming apparatus according to Example 1.

FIG. 1 is a general explanatory view of an image forming apparatus according to Example 1.

In FIG. 1, a copier U as one example of the image forming apparatus according to Example 1 of the present disclosure includes a printer U1 as one example of an image recorder. A scanner U2 as one example of a reading unit and as one example of an image reading device is supported above the printer U1. An autofeeder U3 as one example of a document transporting device is supported above the scanner U2.

A document tray TG1 as one example of a medium housing part is disposed above the autofeeder U3. On the document tray TG1, multiple documents Gi that are to be copied can be stacked and housed. A paper output tray TG2 for documents as one example of a document discharge part is formed below the document tray TG1. Between the document tray TG1 and the paper output tray TG2 for documents, a document transport roller U3b is disposed along a document transport path U3a.

A platen glass PG as one example of a transparent document table is disposed at the upper surface of the scanner U2. In the scanner U2 according to Example 1, a reading unit U2a as one example of a reader is disposed below the platen glass PG. The reading unit U2a according to Example 1 is supported along the lower surface of the platen glass PG to be movable in the left-right direction as one example of a sub-scanning direction. The reading unit U2a is electrically connected to the image processor GS.

The image processor GS is electrically connected to a writing circuit DL of the printer U1. The writing circuit DL is electrically connected to exposure devices LHy, LHm, LHc, and LHk as one example of a latent image forming unit.

The exposure devices LHy to LHk according to Example 1 are configured by, for example, an LED head in which multiple LEDs are arranged in a main scanning direction. The exposure devices LHy to LHk are configured to be able to output writing light corresponding to each of colors of Y, M, C, and K in accordance with a signal that is input from the writing circuit DL.

The writing timing of the writing circuit DL and the power supply timing of a power supply circuit E are controlled in accordance with a control signal from a controller C as one example of a control unit.

In FIG. 1, photoreceptors PRy, PRm, PRc, and PRk as one example of an image holding part are disposed above the exposure devices LHy to LHk. In FIG. 1, writing regions Q1y, Q1m, Q1c, and Q1k are configured by regions in which writing light is radiated with respect to each of the photoreceptors PRy to PRk.

Charging rollers CRy, CRm, CRc, and CRk as one example of a charging part are disposed on the upstream side of the writing regions Q1y to Q1k in a rotation direction of the photoreceptors PRy to PRk. The charging rollers CRy to CRk according to Example 1 are supported in contact with the photoreceptors PRy to PRk to be rotatable by following the photoreceptors PRy to PRk.

Developing devices Gy, Gm, Gc, and Gk as one example of a developing unit are disposed on the downstream side of the writing regions Q1y to Q1k in the rotation direction of the photoreceptors PRy to PRk. Developing regions Q2y, Q2m, Q2c, and Q2k are configured by regions in which the photoreceptors PRy to PRk and the developing devices Gy to Gk face each other.

Primary transfer rollers T1y, T1m, T1c, and T1k as one example of a primary transfer part are disposed on the downstream side of the developing devices Gy to Gk in the rotation direction of the photoreceptors PRy to PRk. Primary transfer regions Q3y, Q3m, Q3c, and Q3k are configured by regions in which the photoreceptors PRy to PRk and the primary transfer rollers T1y to T1k face each other.

Photoreceptor cleaners CLy, CLm, CLc, and CLk as one example of a cleaning part are disposed on the downstream side of the primary transfer rollers T1y to T1k in the rotation direction of the photoreceptors PRy to PRk.

As one example of a yellow-visible-image forming part according to Example 1, a yellow image forming member Uy that forms a yellow toner image is configured by the photoreceptor PRy, the charging roller CRy, the exposure device LHy, the developing device Gy, the primary transfer roller T1y, and the photoreceptor cleaner CLy that are for yellow. Similarly, a magenta image forming member Um, a cyan image forming member Uc, and a black image forming member Uk are configured by the photoreceptors PRm, PRc, and PRk, the charging rollers CRm, CRc, and CRk, the exposure devices LHm, LHc, and LHk, the developing devices Gm, Gc, and Gk, the primary transfer rollers T1m, T1c, and T1k, and the photoreceptor cleaners CLm, CLc, and CLk, respectively.

A belt module BM as one example of an intermediate transfer device is disposed above the photoreceptors PRy to PRk. The belt module BM includes an intermediate transfer belt B as one example of an image holding part and as one example of an intermediate transfer part. The intermediate transfer belt B is configured by an endless belt-shaped member.

The intermediate transfer belt B according to Example 1 is rotatably supported by a tension roller Rt as one example of a stretching part, a walking roller Rw as one example of a deviation correcting part, an idler roller Rf as one example of a driven part, a backup roller T2a as one example of a part that faces a secondary transfer region, the primary transfer rollers T1y to T1k, and a drive roller Rd as one example of a driving part. In Example 1, the intermediate transfer belt B is rotated in response to a driving force being transmitted to the drive roller Rd.

A secondary transfer roller T2b as one example of a secondary transfer part is disposed at a position facing the backup roller T2a with the intermediate transfer belt B interposed therebetween. As one example of a transfer device, a secondary transfer unit T2 according to Example 1 is configured by the backup roller T2a, the secondary transfer roller T2b, and the like. A secondary transfer region Q4 is configured by a region in which the secondary transfer roller T2b and the intermediate transfer belt B are in contact with each other.

A belt cleaner CLb as one example of an intermediate-transfer-body cleaning device is disposed on the downstream side of the secondary transfer region Q4 in a rotation direction of the intermediate transfer belt B.

A transfer device T1+T2+B according to Example 1 as one example of a transfer part is configured by the primary transfer rollers T1y to T1k, the intermediate transfer belt B, the secondary transfer unit T2, and the like. An image recorder Uy to Uk+T1+T2+B according to Example 1 is configured by the image forming members Uy to Uk and the transfer device T1+T2+B.

In Example 1, the walking roller Rw as one example of a second supporting part is disposed above the backup roller T2a as one example of a first supporting part in the direction of gravity. In other words, the walking roller Rw that is disposed immediately downstream of the backup roller T2a is disposed above the backup roller T2a in the direction of gravity. In Example 1, the drive roller Rd is disposed above the walking roller Rw in the direction of gravity. Therefore, on the downstream side of the secondary transfer region Q4 as one example of a final transfer region, the intermediate transfer belt B according to Example 1 is inclined upward toward the downstream side in the rotation direction of the intermediate transfer belt B. In Example 1, an angle θ1 formed by a surface of the intermediate transfer belt B that has passed through the secondary transfer region Q4 with respect to the horizontal direction is set to, for example, 15°.

The belt cleaner CLb according to Example 1 is disposed to face the drive roller Rd.

In Example 1, a configuration in which the walking roller Rw is disposed between the backup roller T2a and the drive roller Rd is exemplified. The configuration is, however, not limited thereto. In the configuration, the walking roller Rw may be disposed at the position of the idler roller Rf, or a different mechanism that corrects deviation may be provided without the provision of the walking roller Rw. In these cases, the second supporting part is the drive roller Rd, and the drive roller Rd functions as both the second supporting part and the driving part. When the drive roller Rd functions as both the second supporting part and the driving part, the number of components may be reduced. Meanwhile, by disposing the second supporting part (walking roller Rw) and the driving part (drive roller Rd) individually, as in Example 1, it may be possible to move each of the positions of the second supporting part and the driving part. Thus, flexibility in design may be increased, and it may become easy to cope with the orientation of the intermediate transfer belt B, restriction of the internal space of the copier U, and the like.

In FIG. 1, paper-feeding trays TR1 and TR2 as one example of a paper feeding part are disposed below the image forming members Uy to Uk. The paper-feeding trays TR1 and TR2 are supported to be extractable and insertable in the front-rear direction. Recording paper S as one example of a medium is housed on the paper-feeding trays TR1 and TR2.

In Example 1, the first paper-feeding tray TR1 on the upper side is disposed to be inclined upward from the right side, which is the upstream side in the transport direction of the recording paper S, toward the left side, which is the downstream side. In Example 1, an inclination angle θ2 of the bottom surface of the first paper-feeding tray TR1 with respect to the horizontal direction is set to 35°.

The second paper-feeding tray TR2 on the lower side is disposed horizontally in the transport direction of recording paper. Therefore, in Example 1, the maximum size of the recording paper S that can be housed on the first paper-feeding tray TR1 on the upper side is larger than that of the recording paper S that can be housed on the second paper-feeding tray TR2.

A pickup roller Rp as one example of a take-out part is disposed on the upper left side of each of the paper-feeding trays TR1 and TR2. A separating roller Rs as one example of a separating part is disposed on the downstream side of the pickup roller Rp in the transport direction of the recording paper S. As one example of a medium transport path, a paper-feeding path SH1 extending upward is formed on the downstream side of the separating roller Rs in the transport direction of the recording paper S. Multiple transport rollers Ra as one example of a transporting part are disposed in the paper-feeding path SH1.

A manual feeding tray TR0 as one example of a paper feeding part is disposed at a lower left portion of the copier U. At an upper right portion of the manual feeding tray TR0, a pickup roller Rp0 is disposed, and a manual paper-feeding path SH0 extends. The manual paper-feeding path SH0 joins the paper-feeding path SH1.

In the paper-feeding path SH1, a registration roller Rr as one example of a transport-timing adjuster is disposed on the upstream side of the secondary transfer region Q4. A transport path SH2 extends from the registration roller Rr toward the secondary transfer region Q4.

A fixing device F as one example of a fixing unit is disposed on the downstream side of the secondary transfer region Q4 in the transport direction of the recording paper S. The fixing device F includes a heating roller Fh as one example of a fixing member for heating and a pressurizing roller Fp as one example of a fixing member for pressurizing. A fixation region Q5 is configured by a region in which the heating roller Fh and the pressurizing roller Fp are in contact with each other.

A lower paper output tray TRh as one example of a medium discharge part is formed at the upper surface of the printer U1. Above the fixing device F, a paper output path SH3 as one example of a transport path extends toward the lower paper output tray TRh. A paper output roller Rh as one example of a medium transporting part is disposed at the downstream end of the paper output path SH3.

An upper paper output tray TRh2 as one example of a medium discharge part is disposed above the lower paper output tray TRh. An upper transport path SH4 that branches from the paper output path SH3 and that extends toward the upper paper output tray TRh2 is formed above the fixing device F.

As one example of a medium transporting part, a reversing roller Rb that is rotatable forwardly and reversely is disposed in the upper transport path SH4. Above a position at which the upper transport path SH4 branches from the paper output path SH3, a reversing path SH6 as one example of a medium transport path branches from the upper transport path SH4 toward the lower left side.

A gate GT1 as one example of a switching part is disposed across a part where the upper transport path SH4 branches from the paper output path SH3 and a part where the reversing path SH6 branches from the upper transport path SH4. The gate GT1 is supported to be switchable between a first guide position (second position) at which the recording paper S from the fixing device F is guided toward the lower paper output tray TRh and at which the recording paper S is guided from the upper transport path SH4 to the reversing path SH6 and a second guide position (first position) at which the recording paper S from the fixing device F is guided to the upper transport path SH4.

The multiple transport rollers Ra as one example of a medium transporting part are disposed in the reversing path SH6. The downstream end of the reversing path SH6 joins the paper-feeding path SH1 on the upstream side of the registration roller Rr.

Image Formation Operation

In the copier U according to Example 1 having the configuration, when an operator manually places the document Gi on the platen glass PG to copy the document Gi, the reading unit U2a moves from an initial position in the left-right direction, and the document Gi on the platen glass PG is scanned while being exposed to light. When the autofeeder U3 is used to automatically transport and copy the document Gi, multiple documents Gi housed on the document tray TG1 are sequentially transported to and pass through a document reading position on the platen glass PG and discharged onto the paper output tray TG2 for documents. Each document Gi that sequentially passes through the reading position on the platen glass PG is exposed to light and scanned by the reading unit U2a. Reflection light from the document Gi is received by the reading unit U2a. The reading unit U2a converts the received reflection light reflected by the document Gi into electric signals. When both faces of the document Gi are to be read, the document Gi is also read by a reading sensor.

The image processor GS receives electric signals that are output from the reading unit U2a. The image processor GS converts electric signals of an image of colors of R, G, and B read by the reading unit U2a into image information of yellow (Y), magenta (M), cyan (C), and black (K) for latent image formation. The image processor GS outputs image information after conversion to the writing circuit DL of the printer U1. When an image is a single color image, that is monochromatic, the image processor GS outputs image information of only black (K) to the writing circuit DL.

The writing circuit DL outputs a control signal corresponding to inputted image information to the exposure devices LHy to LHk. The exposure devices LHy to LHk output writing light corresponding to the control signal.

Each of the photoreceptors PRy to PRk is driven to rotate when image formation is started. A charging voltage is applied to the charging rollers CRy to CRk from the power supply circuit E. Consequently, surfaces of the photoreceptors PRy to PRk are charged by the charging rollers CRy to CRk. In the writing regions Q1y to Q1k, latent images are formed on surfaces of the charged photoreceptors PRy to PRk by the exposure devices LHy to LHk. In the developing regions Q2y to Q2k, the latent images on the photoreceptors PRy to PRk are developed into toner images as one example of an image by the developing devices Gy to Gk.

The developed toner images are transported to the primary transfer regions Q3y to Q3k in contact with the intermediate transfer belt B as one example of an intermediate transfer body. In the primary transfer regions Q3y to Q3k, a primary transfer voltage having a polarity opposite to a charge polarity of toner is applied from the power supply circuit E to the primary transfer rollers T1y to T1k. Consequently, the toner images on the photoreceptors PRy to PRk are transferred onto the intermediate transfer belt B by the primary transfer rollers T1y to T1k. In the case of multicolor toner images, a toner image transferred on the intermediate transfer belt B in the primary transfer region on the upstream side is overlaid with a toner image on the downstream side.

Residues and deposits on the photoreceptors PRy to PRk after primary transfer are removed by the photoreceptor cleaners CLy to CLk. The surfaces of the cleaned photoreceptors PRy to PRk are recharged by the charging rollers CRy to CRk.

A single-color or multicolor toner image transferred on the intermediate transfer belt B by the primary transfer rollers T1y to T1k in the primary transfer regions Q3y to Q3k is transported to the secondary transfer region Q4.

The recording paper S on which an image is to be recorded is taken out by the pickup roller Rp of the paper-feeding tray TR1 or TR2 that is to be used. When multiple sheets of the recording paper S are taken out in a stacked state by the pickup roller Rp, the sheets of the recording paper S are separated to be individual sheets by the separating roller Rs. The recording paper S separated by the separating roller Rs is transported in the paper-feeding path SH1 by the transport rollers Ra. The recording paper S transported in the paper-feeding path SH1 is sent to the registration roller Rr. The recording paper S stacked on the manual feeding tray TR0 is also sent to the paper-feeding path SH1 through the manual paper-feeding path SH0 by the pickup roller Rp0.

The registration roller Rr transports the recording paper S to the secondary transfer region Q4 at a timing when a toner image formed on the intermediate transfer belt B is transported to the secondary transfer region Q4. A secondary transfer voltage having a polarity opposite to a charge polarity of toner is applied to the secondary transfer roller T2b by the power supply circuit E. Consequently, the toner image on the intermediate transfer belt B is transferred from the intermediate transfer belt B onto the recording paper S.

Deposits and the like adhering to the surface of the intermediate transfer belt B after secondary transfer are removed by the belt cleaner CLb.

The recording paper S on which the toner image is secondarily transferred is heated and fixed when passing through the fixation region Q5.

To discharge the recording paper S on which an image is fixed onto the lower paper output tray TRh, the gate GT1 moves to the first guide position. Consequently, the recording paper S sent from the fixing device F is transported in the paper output path SH3. The recording paper S transported in the paper output path SH3 is discharged onto the lower paper output tray TRh by the paper output roller Rh.

To discharge the recording paper S onto the upper paper output tray TRh2, the gate GT1 moves to the second guide position so that the recording paper S is discharged onto the upper paper output tray TRh2.

When the recording paper S is to be subjected to double-sided printing, the gate GT1 moves to the second guide position. When the rear end of the recording paper S has passed through the gate GT1, the gate GT1 moves to the first guide position, and the reversing roller Rb rotates reversely. Consequently, the recording paper S is guided by the gate GT1 to be sent to the reversing path SH6.

Explanatory Views of Frame Body

Figure 2:
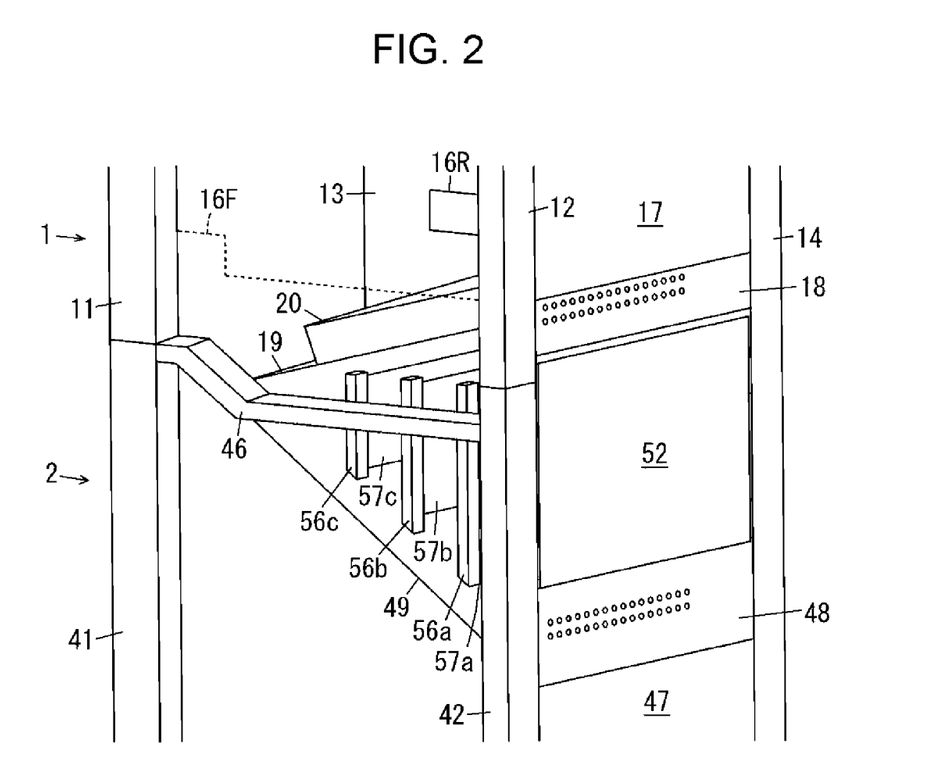
FIG. 2 is an explanatory view of a frame body part of an image forming apparatus according to Example 1.

FIG. 2 is an explanatory view of a frame body part of the image forming apparatus according to Example 1.

Figure 3:
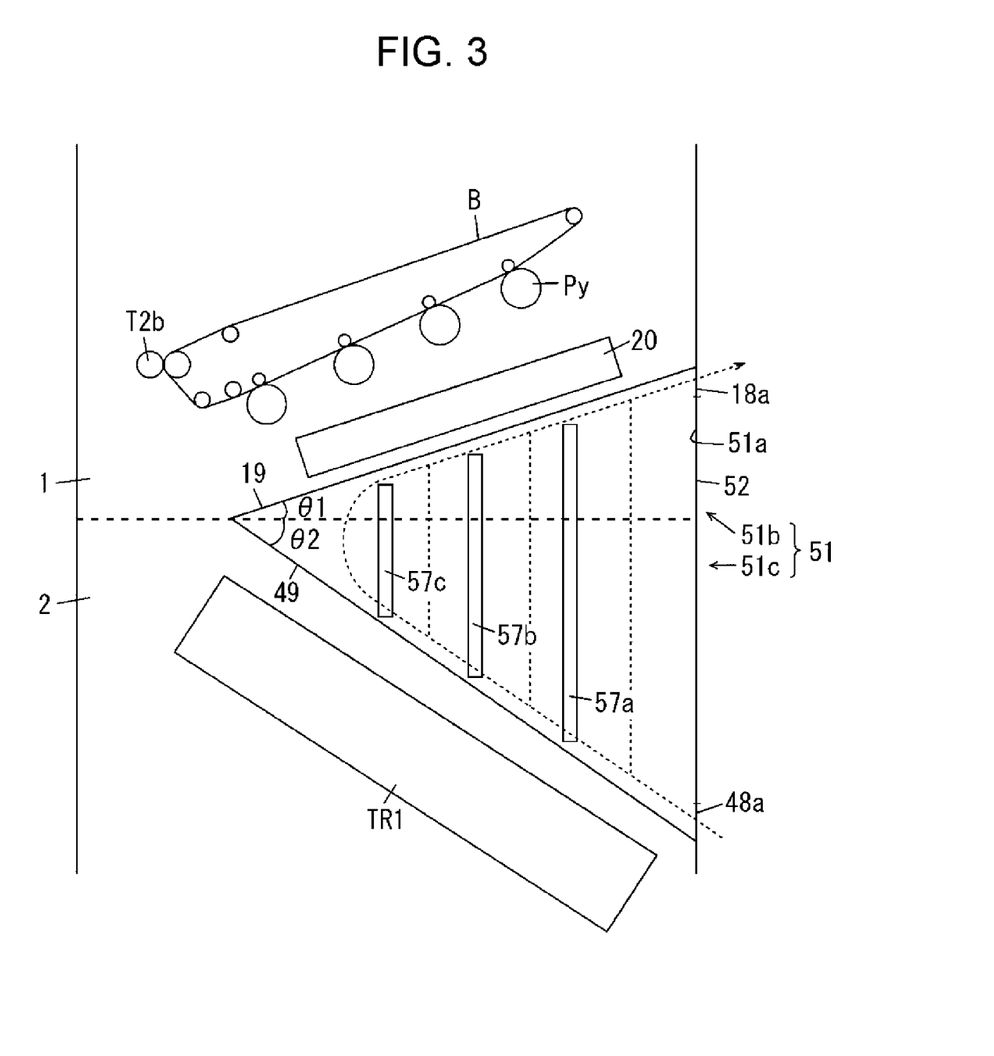
FIG. 3 is an explanatory view of an airflow in a narrowed space part according to Example 1.

FIG. 3 is an explanatory view of an airflow in a narrowed space part according to Example 1.

Figure 4A:
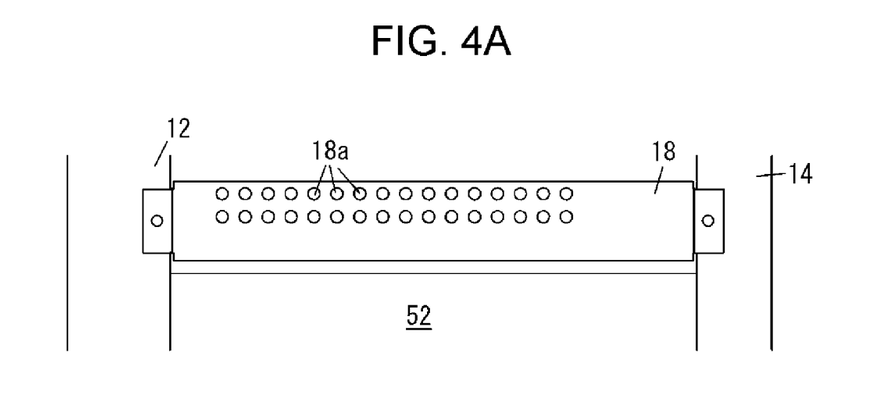
FIGS. 4A and 4B are explanatory views of wall members according to Example 1, FIG. 4A being an explanatory view of a first wall member, FIG. 4B being an explanatory view of a second wall member.
Figure 4B:
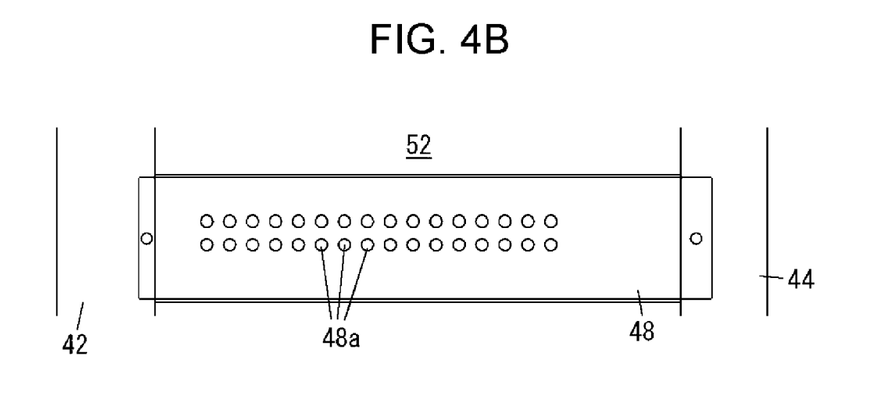

FIGS. 4A and 4B are explanatory views of wall members according to Example 1. FIG. 4A is an explanatory view of a first wall member, and FIG. 4B is an explanatory view of a second wall member.

In FIG. 2, the copier U according to Example 1 includes an upper frame body 1 as one example of a second housing, and a lower frame body 2 as one example of a first housing. The image recorders Uy to Uk+T1+T2+B, the fixing device F, and the like are housed in the inside of the upper frame body 1. The paper-feeding trays TR1 and TR2 and the like are housed in the inside of the lower frame body 2.

The upper frame body 1 includes upper vertical frames 11 to 14 as one example of a vertical frame body disposed in correspondence with the positions of four corners at the front, rear, left, and right. The upper vertical frames 11 to 14 extend in the up-down direction. A front lateral frame 16F as one example of a lateral frame body is supported between a lower portion of the upper vertical frame 11 on the left front side and a lower end portion of the upper vertical frame 12 on the right front side. A right lateral frame 17 as one example of a lateral frame body is supported between the upper vertical frame 12 on the right front side and the upper vertical frame 14 on the right rear side. A rear lateral frame 16R is supported between the upper vertical frame 13 on the left rear side and the upper vertical frame 14 on the right rear side. Although illustration and description are omitted, a lateral frame body is supported also between the upper vertical frame 11 on the left front side and the upper vertical frame 13 on the left rear side.

Between the upper vertical frame 12 on the right front side and the upper vertical frame 14 on the right rear side, an upper tie bar 18 as one example of a first wall member is supported below the right lateral frame 17. The upper tie bar 18 is configured by a plate-shaped metal member, that is, a sheet metal. In FIG. 4A, the upper tie bar 18 has upper punched holes 18a as one example of a first ventilation part. The upper punched holes 18a each have a round hole shape, and multiple upper punched holes 18a are disposed to be spaced from each other in the front-rear direction. The upper punched holes 18a in Example 1 are formed in a width that is longer than the widths of circuit boards (57a to 57c), which will be described later, in the front-rear direction.

As one example of a second inclined portion, a plate-shaped bottom plate 19 is disposed at a lower portion of the upper frame body 1. The plate-shaped bottom plate 19 is supported between the front and rear lateral frames 16F and 16R. The bottom plate 19 according to Example 1 is disposed to be inclined upward from the left side (the other side surface of the body of the image forming apparatus) toward the right side (one side surface) in accordance with the inclination angle θ1 at which the intermediate transfer belt B and the photoreceptors PRy to PRk are disposed. In addition, a high-voltage power supply board 20 as one example of a circuit board is supported on the upper side of the bottom plate 19.

Lower vertical frames 41 to 44 as one example of a vertical frame body are disposed at the lower frame body 2 in correspondence with the upper vertical frames 11 to 14. The lower vertical frames 41 to 44 extend in the up-down direction. A front lower frame 46 as one example of a lateral frame body is supported between an upper end portion of the lower vertical frame 41 on the left front side and an upper end portion of the lower vertical frame 42 on the right front side. In addition, a right lower frame 47 as one example of a lateral frame body is supported between the lower vertical frame 42 on the right front side and the lower vertical frame 44 on the right rear side. Although detailed description is omitted, lateral frame bodies are also supported at lower end portions between the lower vertical frame 41 on the left front side and the lower vertical frame 43 on the left rear side and between the lower vertical frame 43 on the left rear side and the lower vertical frame 44 on the right rear side.

Between the lower vertical frame 42 on the right front side and the lower vertical frame 44 on the right rear side, a lower tie bar 48 as one example of a second wall member is supported above the right lower frame 47. The lower tie bar 48 is configured by a plate-shaped metal member, that is, a sheet metal. In FIG. 4B, the lower tie bar 48 has lower punched holes 48a as one example of a second ventilation part. Similarly to the upper punched holes 18a, multiple lower punched holes 48a are disposed to be spaced from each other in the front-rear direction and formed in a width that is longer than the widths of the circuit boards (57a to 57c), which will be described later, in the front-rear direction.

As one example of a first inclined portion, a plate-shaped ceiling plate 49 is disposed at an upper portion of the lower frame body 2. The ceiling plate 49 is supported by the front lower frame 46, the lower vertical frame 42 on the right front side, the lower vertical frame 44 on the right rear side, and the like. The ceiling plate 49 according to Example 1 is disposed to be inclined upward toward the left in accordance with the inclination angle θ2 of the first paper-feeding tray TR1. The left end (inner end) of the ceiling plate 49 extends toward the left end of the bottom plate 19.

A space 51 surrounded by the bottom plate 19 and the ceiling plate 49 is formed in the inside of the copier U according to Example 1. The space 51 has a shape in which a width in the up-down direction is narrowed from the right toward the left. Therefore, the space 51 is a space having a shape that is narrowed from the right toward the far side (left side). In other words, the space 51 is configured by a V-shaped space as viewed from the front.

The space 51 according to Example 1 is configured by a V-shaped upper space 51b surrounded by the bottom plate 19 and the lower end of the upper frame body 1 and a V-shaped lower space 51c surrounded by the ceiling plate 49 and the upper end of the lower frame body 2, the upper space 51b and the lower space 51c being connected with each other. In other words, the space 51 is disposed across the upper frame body 1 and the lower frame body 2. The front lower frame 46 is disposed on the front side of the space 51, thereby restricting access to the space 51 from the front.

An openable covering 52 that is able to open and close the inside of the space 51 is disposed at the right end of the space 51. The openable covering 52 thus closes and opens an opening 51a surrounded by the tie bars 18 and 48, the vertical frames 12 and 42 on the right front side, and vertical frames 14 and 44 on the right rear side. Therefore, the opening 51a is also formed across the upper frame body 1 and the lower frame body 2.

In Example 1, the openable covering 52 does not have the punched holes 18a and 48a.

Figure 5:
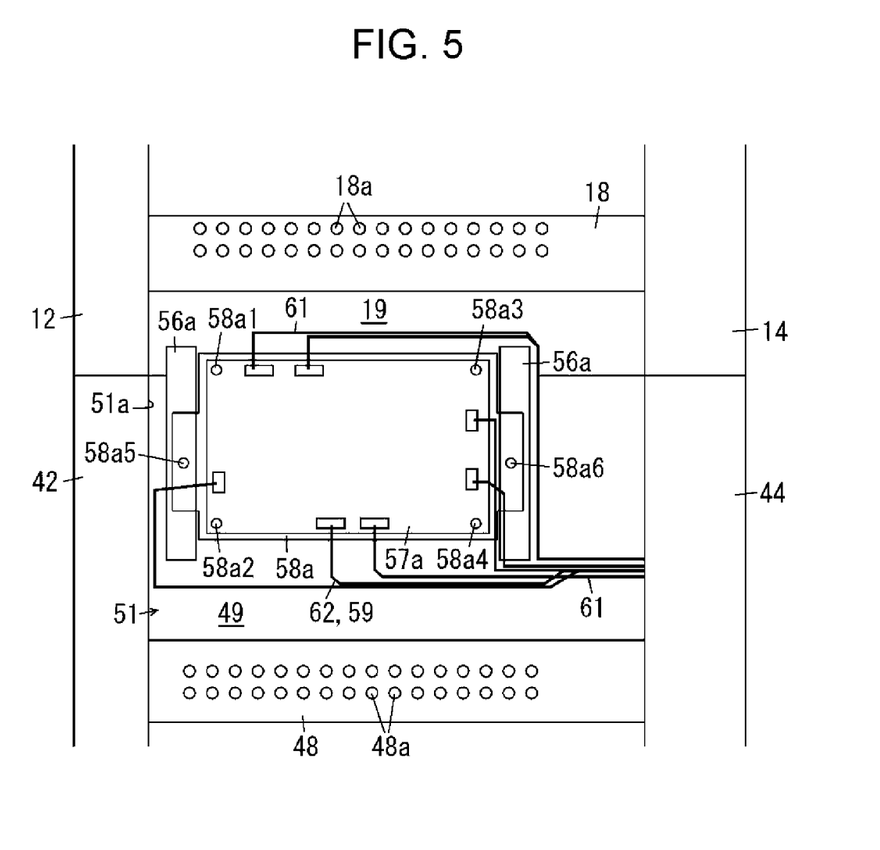
FIG. 5 is an explanatory view of a mounting frame part according to Example 1.

FIG. 5 is an explanatory view of a mounting frame part according to Example 1.

In Example 1, a mounting frame 56 as one example of a mounting part is supported on the upper side of the ceiling plate 49. The mounting frame 56 includes three front-rear pairs (only the front side is illustrated in FIG. 2 and FIG. 3) of mounting frames that are disposed to be spaced from each other in the left-right direction. The length in the up-down direction of a mounting frame 56a on the right side is longer in correspondence with the right portion of the space 51 than the length in the up-down direction of a mounting frame 56b at a center portion, and the length in the up-down direction of a mounting frame 56c on the left side is shorter than the length in the up-down direction of the mounting frame 56b.

A substrate 57a as one example of a first cooled part and as one example of a first detachable part is detachably mounted to the mounting frame 56a on the right side (the nearest side). In FIG. 5, the substrate 57a according to Example 1 is mounted with respect to the mounting frame 56a on the right side via a coupling plate 58a as one example of a coupling part. The coupling plate 58a according to Example 1 has a plate shape. The substrate 57a is screwed to be fixed to the coupling plate 58a at a front upper end 58a1, a front lower end 58a2, a rear upper end 58a3, and a rear lower end 58a4 of four corners. The coupling plate 58a is not limited to a plate-shaped member, and the shape of the coupling plate 58a may be optionally changed. The coupling plate 58a may be a member having a shape that enables coupling of the substrate 57a, for example, a member having a window-frame shape surrounding the outer periphery of the substrate 57a, or the like.

The coupling plate 58a is fastened at two positions at the front and the rear, that is at the fastening positions 58a5 and 58a6 at a center portion in the up-down direction to the mounting frame 56a on the right side by screws as one example of a fastening part. Therefore, in the Example 1, the number (four) of the fastening positions 58a1 to 58a4 at which the substrate 57a and the coupling plate 58a are fastened is set to be larger than the number (two) of the fastening positions 58a5 and 58a6 at which the mounting frame 56a on the right side and the coupling plate 58a are fastened.

In other words, in Example 1, the substrate 57a is detachably supported by the screws at two positions to the mounting frame 56a on the right side via the coupling plate 58a. In Example 1, fastening work, including screwing and dismounting of screws at the two fastening positions 58a5 and 58a6, may be all performed from the right side that is in the same direction through the opening 51a. Therefore, in Example 1, the direction of fastening work is a direction along an attaching-detaching direction in which the substrate 57a is detached and attached integrally with the coupling plate 58a.

When the substrate 57a according to Example 1 is mounted to the mounting frame 56a on the right side, multiple substrate connectors 59 as one example of a detachable terminal are disposed at the right surface of the substrate 57a, that is, the surface on the side of the opening 51a. The substrate connectors 59 are provided to energize elements on the substrate 57a and to send and receive control signals. The substrate connectors 59 are configured such that a connector 62 provided at an end of a wire 61 extending from the printer U1 is attachable to and detachable from the substrate connectors 59 by being inserted into and extracted from the substrate connectors 59 in the left-right direction (that is, the attaching-detaching direction of the substrate 57a). The wire 61 is disposed with respect to the substrate 57a such that the wire 61 surrounds the outer side, and the wired wire 61 is fixed by a publicly known fixing part (not illustrated), such as a harness guide, a clamp, or the like.

In Example 1, the mounting frames 56a to 56c and the coupling plate 58a are each configured by a sheet metal (iron) as one example of a conductive metal material. Therefore, the substrates 57a to 57c are grounded, that is, earthed via the coupling plate 58a and the mounting frames 56a to 56c. The effect of energization may increase as the length of the path of the energization decreases. Therefore, earths may be set at multiple positions. In the case of earthing via screws, when the substrates 57a to 57c are fixed directly to the mounting frames 56a to 56c, energization positions are operation positions (fastening positions 58a1 to 58a4). Thus, the number of operation positions and the number of times of operations are increased. To cope with this, in Example 1, the substrates 57a to 57c are mounted with respect to the mounting frames 56a to 56c via the coupling plate 58a, and screwing work is performed at the two fastening positions 58a5 and 58a6. Therefore, the number of operation positions is reduced compared with a case in which the substrates 57a to 57c are fixed directly on the mounting frames 56a to 56c. Accordingly, in Example 1, in which (the number of the fastening positions 58a1 to 58a4 at which the substrates 57a to 57c and the coupling plate 58a are fastened=4)>(the number of the positions 58a5 and 58a6 at which the coupling plate 58a and the mounting frames 56a to 56c are fastened=2) is satisfied, the number of operation positions is reduced to two while the larger number, that is four, of positions of energization from the substrates 57a to 57c is maintained.

A fixing substrate 57b as one example of a second cooled part and as one example of a first detachable part is detachably mounted to the mounting frame 56b at a center portion. A print server substrate 57c as one example of a third cooled part and as one example of a first detachable part is detachably mounted to the mounting frame 56c on the left side (the farthest side).

The fixing substrate 57b and the print server substrate 57a according to Example 1 are each mounted with respect to the mounting frames 56b and 56c, respectively, via a coupling plate (not illustrated) similar to the coupling plate 58a as one example of a coupling part, similarly to the substrate 57a. Thus, detailed description of the fixing substrate 57b and the print server substrate 57c is omitted. Similarly to the substrate 57a, each of the substrates 57b and 57c is provided with a substrate connector (not illustrated) at a right side surface.

Each of the substrates 57a to 57c is configured by a plate-shaped substrate and is mounted in a state of extending in the up-down direction. The upper and lower ends of each of the substrates 57a to 57c are disposed to be spaced (with a gap) from the bottom plate 19 and the ceiling plate 49.

In Example 1, among the substrates 57a to 57c, the print server substrate 57c on the far side is configured to have the smallest area, and the substrate 57a on the near side is configured to have the largest area. In Example 1, among the substrates 57a to 57c, the substrate 57a generates the largest amount of heat and is configured by a substrate for which necessity of cooling may be highest, and the print server substrate 57c is configured by a substrate for which necessity of cooling may be lowest.

In Example 1, medium transporting parts, such as the paper-feeding path SH1 and the transport path SH2, are disposed on a side opposite the space 51, that is, on the side of the other side surface.

Operation in Example 1

In the copier U according to Example 1 having the configuration, it may be possible to attach and detach the substrates 57a to 57c in the inside of the copier U with the openable covering 52 opened. It may be possible to attach and detach the substrates 57a to 57c through the opening 51a of the space 51. In other words, the space 51 having a shape that is narrowed from the right (near side) toward the left (far side) may be accessible from the right at which the opening area of the space 51 is large. Here, in Example 1, the front lower frame 46 is disposed on the front side of the space 51 and configured not to allow replacing work of the substrates 57a to 57c to be performed from the front side with respect to the space 51. In a configuration in which the front lower frame 46 is not provided, the strengths of the frame bodies 1 and 2 may decrease and may easily generate distortion, vibration, and abnormal noise. However, in Example 1, in which the front lower frame 46 is provided, the strengths of the frame bodies 1 and 2 may be ensured. Therefore, it may be possible in Example 1 to easily perform replacing work of the substrates 57a to 57c with respect to the space 51 while ensuring the strengths of the frame bodies 1 and 2.

In addition, in Example 1, the multiple substrates 57a to 57c are housed in the space 51, and the space 51 may be effectively used compared with a case in which only one substrate is housed in the space 51.

Further, in Example 1, the substrates 57a to 57c configured by circuit boards that are to be connected to the wire 61 are attachable and detachable. In other words, attaching-detaching work of the substrates 57a to 57c that are to be connected to the wire 61 may be complicated and burdensome compared with a substrate that is not to be connected to the wire 61. In addition, as the number of substrates that are to be connected to the wire 61 increases, work may become more burdensome. To cope with this, in Example 1, it may be possible to perform work by performing mounting, and connection with the wire 61 sequentially for each of the print server substrate 57c on the far side, the fixing substrate 57b at a center portion, and the substrate 57a on the near side. Thus, workability may be improved.

In particular, in Example 1, the substrate connectors 59 to be connected with the wire 61 are disposed at the right surface, that is, on the side of the opening 51a through which work is performed, and work may be easy compared with a case in which the substrate connectors 59 are disposed at the left surface.

In addition, in Example 1, the substrates 57a to 57c are mounted with respect to the mounting frames 56a and 56c via the coupling plate 58a. Although it may be possible to mount the substrates 57a to 57c onto the mounting frames 56a to 56c, work for mounting the four corners of each of the substrates 57a to 57c onto the mounting frames 56a to 56c includes work at the corner portions of the opening surface. Thus, workability may be degraded due to, for example, handling of a fastening tool (driver) and the like. To cope with this, in Example 1, in which the coupling plate 58a is interposed, the positions of fastening between the coupling plate 58a and the mounting frames 56a to 56c may be set at positions that differ from the positions of the four corners. Thus, workability in attaching-detaching work may be improved.

In particular, in Example 1, the number (two) of the fastening positions 58a5 and 58a6 between the mounting frames 56a to 56c and the coupling plate 58a is less than the number (four) of the fastening positions 58a1 to 58a4 between the substrate 57a and the coupling plate 58a. Fastening between the substrate 57a and the coupling plate 58a may be not be performed in the inside of the narrow space 51 and may be performed in a wide space outside the copier U. Therefore, even when the number of the fastening positions between the substrate 57a and the coupling plate 58a is large, workability may not be easily degraded. In addition, although fastening between the coupling plate 58a and the mounting frames 56a to 56c is performed in the inside of the narrow space 51, the number of the fastening portions is small. Therefore, workability may be improved in Example 1 compared with a case in which the number of fastening positions is large, such as a case in which the substrate and the mounting frames are directly fastened at four positions without the coupling plate 58a.

In addition, in Example 1, In addition, in Example 1, working directions of work of fastening between the coupling plate 58a and the mounting frames 56a to 56c are all set to the same direction (from the right side). Therefore, compared with a case in which the working direction is different for each of the fastening positions 58a5 and 58a6, workability may be improved. In particular, in Example 1, the working directions of the fastening work are in the attaching-detaching direction of the substrates 57a to 57c, and it may be possible to perform work through the wide opening 51a through which attaching and detaching of the substrates 57a to 57c are performed. Therefore, compared with a case in which the working directions of the fastening work and the attaching-detaching direction of the substrates 57a to 57c differ from each other, workability may be improved.

Further, in Example 1, the opening 51a of the space 51 is formed across the upper frame body 1 and the lower frame body 2. In other words, a frame for coupling in the front-rear direction at the lower end of the upper frame body 1 and a frame for coupling in the front-rear direction at the upper end of the lower frame body 2 are not provided at the right side surface of the copier U. Therefore, compared with a case in which a frame for coupling in the front-rear direction is provided, the strength may be decreased. In other words, in the copier U, distortion and deformation may be easily generated on the right side where the opening 51a is formed, compared with the left side where the opening 51a is not formed. Generation of deformation or the like may cause changes in the positions and the intervals between members and may degrade accuracy of image formation.

To cope with this, in Example 1, the paper-feeding path SH1, the transport path SH2, and the like are disposed on the left side, which is a side opposite the opening 51a on the right side of the copier U. Therefore, the secondary transfer region Q4 and transport of the recording paper S, for which high accuracy may be required in image formation, are disposed on the left side having relatively high strength. In other words, in Example 1, the transport paths SH1 and SH2, for which accuracy may be required, are disposed on the left side having high strength, and attaching and detaching of the substrates 57a to 57c are performed from the right side through the opening 51a. In particular, the opening 51a is provided across the two frame bodies 1 and 2 with no frame provided midway of the opening 51a, and the opening 51a may be ensured to be wide, compared with a case in which a frame is disposed midway of the opening 51a. Therefore, attaching-detaching work may be easy compared with a case in which the opening 51a is narrow. Thus, in Example 1, while accuracy of transport and transfer of the recording paper S is ensured, workability of attaching-detaching work of the substrates 57a to 57c is also ensured.

In the copier U according to Example 1, when the copier U is operated in a state in which the substrates 57a to 57c are mounted with the openable covering 52 closed, each of the substrates 57a to 57c generates heat in response to energization. When the air in the space 51 rises by being heated when heat is generated, the air is guided along the bottom surface of the bottom plate 19 toward the right upper side and is discharged through the upper punched holes 18a. Along with gas discharging through the upper punched holes 18a, outside air flows into the space 51 from the outside through the lower punched holes 48a. The outside air that has flowed into the space 51 is guided leftward along the ceiling plate 49, flows into gaps between substrates 57a to 57c, and cools the substrates 57a to 57c. Therefore, the outside air that has flowed into the space 51 may be able to cool, as indicated by the broken line with arrow in FIG. 3, the space 51 up to the far side where the space 51 is narrowed.

In particular, in Example 1, the substrates 57a to 57c are disposed in the up-down direction, the space 51 is partitioned by the substrates 57a to 57c, and air may be easily guided along the substrates 57a to 57c. Therefore, compared with a case in which the substrates 57a to 57c are arranged in the horizontal direction, air may flow smoothly, and cooling efficiency may be improved.

Further, in Example 1, among the multiple substrates 57a to 57c, the substrate 57a for which necessity of cooling may be highest is disposed on the outer side (the side of the opening 51a), that is, at a position near the lower punched holes 48a. After cool outside air flows into the space 51, the temperature of the air is increased on the way to the far side of the space 51. Therefore, the temperature of the air is lower and cooling efficiency may be higher toward the outer side. Thus, compared with a case in which a member for which necessity of cooling may be high is disposed on the narrowed far side of the space 51, cooling efficiency may be high in Example 1.

In addition, in Example 1, in the front-rear direction, which is the width direction of the multiple substrates 57a to 57c, the punched holes 18a and 48a are formed in a width longer than the widths of the substrates 57a to 57c, in other words, to the outer side of the widths. Therefore, the gas that has flowed in through the punched holes 18a and 48a may be able to cool the entire regions in the width direction of the substrates 57a to 57c. Consequently, cooling efficiency may be high compared with a case in which the punched holes 18a and 48a are formed only to the inner side of the widths of the substrates 57a to 57c.

In addition, in Example 1, the punched holes 18a and 48a are formed, not in the openable covering 52, in the tie bars 18 and 48, which are strong members that reinforce the copier U. Therefore, compared with a case in which the punched holes 18a and 48a are formed in the openable covering 52 without the provision of the tie bars 18 and 48, strength and rigidity of the entirety of the copier U may be improved.

In addition, in Example 1, the round-hole-shaped punched holes 18a and 48a are formed as one example of a ventilation part. A ventilation part having a slit shape or a rectangular hole shape may be employed. However, a round hole may easily suppress a decrease in the strength of the tie bars 18 and 48 compared with a case in which a slit or a rectangular hole is formed. Therefore, the strength of the tie bars 18 and 48 may be ensured in Example 1, compared with a case in which a slit or a rectangular hole is formed.

In Example 1, a transporting part, for example, a fan, a blower, or the like, that transports a gas in the space 51 is not provided. Therefore, manufacturing costs and power consumption may be reduced compared with a case in which a fan or the like is used. A transporting part, such as a fan, a blower, or the like, for discharging a gas whose temperature is increased from the space 51 and introducing outside air into the space 51 may be provided. When a fan, a blower, or the like is provided, cooling performance may be stabilized by the amount of a gas transported by the fan or the like. A fan or the like may be disposed at both the upper punched holes 18a and the lower punched holes 48a or may be disposed at one of the upper punched holes 18a and the lower punched holes 48a. In a case of disposing a fan or the like at one of the upper punched holes 18a and the lower punched holes 48a, it may be efficient to set the fan or the like in correspondence with the upper punched holes 18a since an inside gas whose temperature is increased may be easily discharged.

Modifications

Examples according to the present disclosure have been described above in detail. The present disclosure is, however, not limited to the examples and may be variously changed within the scope of the gist of the present disclosure described in the claims. Modifications (H01) to (H07) of the present disclosure will be exemplified below.

(H01) In the examples, the copier U as one example of an image forming apparatus is exemplified. The present disclosure is, however, not limited thereto and is applicable to a facsimile machine and applicable to a complex machine or the like having multiple functions of a facsimile machine, a printer, a copier, and the like. In addition, the present disclosure is not limited to a multicolor-development image forming apparatus and may be configured by a single-color, that is, monochromatic image forming apparatus.

(H02) In the examples, the exemplified specific numerical values may be changed, as appropriate, in accordance with changes in design and specifications. Therefore, when ease of adhering of paper dust to the intermediate transfer belt B changes depending on the material of the surface of the intermediate transfer belt, the inclination angle θ1 of the intermediate transfer belt B may be also changed in accordance with the change. In addition, the inclination angle θ2 of the first paper-feeding tray TR1 may be also changed, as appropriate, in accordance with the maximum size of usable recording paper S and the lateral width of the copier U.

(H03) In the examples, a case in which the intermediate transfer belt B is used as an image holding part is exemplified. The present disclosure is, however, not limited thereto. The present disclosure is also applicable to a case in which an image holding part like a photoreceptor belt is used.

(H04) In the examples, a configuration in which the mounting frame 56 is fixed to the ceiling plate 49 that is fixed to the lower frame body 2 is exemplified. The present disclosure is, however, not limited thereto. A configuration in which the mounting frame 56 is fixed to the upper frame body 1 or fixed to the bottom plate 19 may be employed.

(H05) In the examples, a configuration in which the wire 61 is connected to the substrates 57a to 57c is exemplified. The present disclosure is, however, not limited thereto. Substrates that are not coupled to the wire 61, that is, substrates that do not include the substrate connectors 59 may be employed. Alternatively, one or two of the three substrates may be connected to the wire with the remaining substrate being not connected to the wire. A detachable part that differs from a circuit board, for example, a storage medium or the like, such as a hard disk, may be employed.

(H06) In the examples, the substrate connectors 59 may be configured to be provided at surfaces of the substrates 57a to 57c on the side of the opening 51a to be extractable and insertable in the attaching-detaching direction of the substrates 57a to 57c. The substrate connectors 59 are, however, not limited thereto. A configuration in which the substrate connectors 59 are provided at surfaces of the substrates 57a to 57c on a side opposite the opening 51a or a configuration in which the substrate connectors 59 are inserted and extracted in a direction that differs from the attaching-detaching direction of the substrates 57a to 57c may be employed.

(H07) In the examples, the coupling plate 58a may be provided but is not limited thereto. For example, a configuration in which the substrates 57a to 57c are directly mounted to the mounting frames 56a to 56c may be employed. In addition, a configuration in which the number of the fastening positions between the mounting frames 56a to 56c and the coupling plate 58a is less than the number of the fastening positions between the substrate 57a and the coupling plate 58a may be employed but is not limited thereto. A configuration in which the number of the fastening positions between the mounting frames 56a to 56c and the coupling plate 58a and the number of the fastening positions between the substrate 57a and the coupling plate 58a are the same or a configuration in which the number of the fastening positions between the mounting frames 56a to 56c and the coupling plate 58a is more than the number of the fastening positions between the substrate 57a and the coupling plate 58a may be employed.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. An image forming apparatus comprising:
   a first housing;
   a second housing that is supported above the first housing;
   a mounting part that is mounted on at least one of the first housing and the second housing;
   a detachable part that is disposed across the first housing and the second housing, the detachable part being mounted detachably with respect to the mounting part and being attachable and detachable in an attaching-detaching direction that connects one side surface and another side surface of the first housing;
   a first inclined portion that is disposed at an upper portion of the first housing and is inclined at a first inclination angle with respect to the attaching-detaching direction; and
   a second inclined portion that is disposed at a lower portion of the second housing and is inclined at a second inclination angle with respect to the attaching-detaching direction,
   wherein the detachable part is disposed between the first inclined portion and the second inclined portion with a length direction being perpendicular to the attaching-detaching direction.

2. The image forming apparatus according to claim 1,
wherein the detachable part includes a plurality of detachable parts that are disposed to be spaced from each other in the attaching-detaching direction.

3. The image forming apparatus according to claim 2,
wherein the detachable part is configured by a circuit board that includes a wire.

4. The image forming apparatus according to claim 3,
wherein the wire has an end portion provided with a detachable terminal, the detachable terminal being attachable and detachable by being inserted or extracted in the attaching-detaching direction with respect to a fixed terminal that is fixed on at least one of the first housing and the second housing.

5. The image forming apparatus according to claim 4, comprising:
a coupling part that is detachably supported by the detachable part and supported to be attachable and detachable with respect to the mounting part.

6. The image forming apparatus according to claim 5,
wherein the number of fastening positions at which the detachable part and the coupling part are fastened to each other is more than the number of fastening positions at which the mounting part and the coupling part are fastened to each other.

7. The image forming apparatus according to claim 2, comprising:
a coupling part that is detachably supported by the detachable part and supported to be attachable and detachable with respect to the mounting part.

8. The image forming apparatus according to claim 7,
wherein the number of fastening positions at which the detachable part and the coupling part are fastened to each other is more than the number of fastening positions at which the mounting part and the coupling part are fastened to each other.

9. The image forming apparatus according to claim 3, comprising:
a coupling part that is detachably supported by the detachable part and supported to be attachable and detachable with respect to the mounting part.

10. The image forming apparatus according to claim 9,
wherein the number of fastening positions at which the detachable part and the coupling part are fastened to each other is more than the number of fastening positions at which the mounting part and the coupling part are fastened to each other.

11. The image forming apparatus according to claim 1,
wherein the detachable part is configured by a circuit board that includes a wire.

12. The image forming apparatus according to claim 11,
wherein the wire has an end portion provided with a detachable terminal, the detachable terminal being attachable and detachable by being inserted or extracted in the attaching-detaching direction with respect to a fixed terminal that is fixed on at least one of the first housing and the second housing.

13. The image forming apparatus according to claim 12, comprising:
a coupling part that is detachably supported by the detachable part and supported to be attachable and detachable with respect to the mounting part.

14. The image forming apparatus according to claim 13,
wherein the number of fastening positions at which the detachable part and the coupling part are fastened to each other is more than the number of fastening positions at which the mounting part and the coupling part are fastened to each other.

15. The image forming apparatus according to claim 11, comprising:
a coupling part that is detachably supported by the detachable part and supported to be attachable and detachable with respect to the mounting part.

16. The image forming apparatus according to claim 15,
wherein the number of fastening positions at which the detachable part and the coupling part are fastened to each other is more than the number of fastening positions at which the mounting part and the coupling part are fastened to each other.

17. The image forming apparatus according to claim 1, comprising:
a coupling part that is detachably supported by the detachable part and supported to be attachable and detachable with respect to the mounting part.

18. The image forming apparatus according to claim 17,
wherein the number of fastening positions at which the detachable part and the coupling part are fastened to each other is more than the number of fastening positions at which the mounting part and the coupling part are fastened to each other.

19. The image forming apparatus according to claim 18,
wherein fastening work in which the coupling part is fastened at a plurality of fastening positions with respect to the mounting part is all performed from a side of the one side surface.

20. The image forming apparatus according to claim 1,
wherein the image forming apparatus has one side surface in which an opening is formed across the first housing and the second housing,
wherein the detachable part is attachable and detachable through the opening, and
wherein the image forming apparatus has another side surface along which a transport path in which a medium is transported is disposed.

* * * * *